United States Patent
Tanaka et al.

(10) Patent No.: US 8,727,794 B2
(45) Date of Patent: May 20, 2014

(54) ELECTRONIC CONTROLLER

(75) Inventors: Takaaki Tanaka, Chiyoda-ku (JP); Yasuhiro Takahashi, Chiyoda-ku (JP); Toru Kubo, Minato-ku (JP); Seiji Kato, Minato-ku (JP); Masako Tamura, Chiyoda-ku (JP); Hideki Umemoto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/187,913

(22) Filed: Jul. 21, 2011

(65) Prior Publication Data

US 2012/0276759 A1    Nov. 1, 2012

(30) Foreign Application Priority Data

Apr. 26, 2011 (JP) ................................. 2011-097990

(51) Int. Cl.
*H01R 12/00* (2006.01)

(52) U.S. Cl.
USPC .......................................... 439/76.1; 361/752

(58) Field of Classification Search
USPC .......... 439/76.1; 257/712, 713, 717; 361/736, 361/752
See application file for complete search history.

(56) References Cited

U.S. PATENT DOCUMENTS

| | | | |
|---|---|---|---|
| 4,010,998 A * | 3/1977 | Tolnar et al. | 439/358 |
| 4,466,680 A * | 8/1984 | Sakai et al. | 439/159 |
| 4,990,888 A * | 2/1991 | Vogt et al. | 340/506 |
| 5,003,430 A * | 3/1991 | VonArx et al. | 361/736 |
| 5,467,251 A * | 11/1995 | Katchmar | 361/719 |
| 5,909,915 A * | 6/1999 | Okuda | 29/841 |
| 5,923,084 A * | 7/1999 | Inoue et al. | 257/712 |
| 5,966,291 A * | 10/1999 | Baumel et al. | 361/707 |
| 6,590,777 B2 * | 7/2003 | Morino et al. | 361/736 |
| 6,881,096 B2 * | 4/2005 | Brown et al. | 439/620.01 |
| 6,890,206 B2 * | 5/2005 | Distad et al. | 439/372 |
| 6,948,949 B1 * | 9/2005 | Schwartz et al. | 439/76.1 |
| 7,018,242 B2 * | 3/2006 | Brown et al. | 439/676 |
| 7,035,108 B2 * | 4/2006 | Wakabayashi et al. | 361/719 |
| 7,128,614 B1 * | 10/2006 | Wu | 439/638 |
| 7,435,106 B2 * | 10/2008 | Su et al. | 439/76.1 |
| 7,514,784 B2 * | 4/2009 | Mayuzumi et al. | 257/712 |
| 7,813,134 B2 * | 10/2010 | Katsuro | 361/714 |
| 7,934,312 B2 * | 5/2011 | Mayuzumi et al. | 29/841 |

(Continued)

FOREIGN PATENT DOCUMENTS

| | | |
|---|---|---|
| JP | 3108559 U | 11/1991 |
| JP | 6334358 A | 12/1994 |

(Continued)

*Primary Examiner* — Amy Cohen Johnson
*Assistant Examiner* — Vladimir Imas
(74) *Attorney, Agent, or Firm* — Sughrue Mion, PLLC (57) ABSTRACT

Provided is an electronic controller, which allows the use of a general-purpose connector, and does not require setting of a case for housing an electronic circuit board therein for respective connectors each having a different shape so as to enable a reduction in cost. An electronic controller (1) includes: an electronic circuit board (2) onto which an electronic component (16) is mounted; a connector (3) provided at an end of the electronic circuit board (2); a case (6) housing the electronic circuit board (2) therein and including an opening portion (6a) on a side of the connector (3); and a connector retaining member (4) provided between the connector (3) and an inner wall surface of the opening portion (6a) so as to be held in close contact with the inner wall surface and to surround the connector (3).

16 Claims, 8 Drawing Sheets

(56) References Cited

U.S. PATENT DOCUMENTS

2006/0012034 A1* 1/2006 Kadoya et al. ............... 257/712
2009/0147482 A1* 6/2009 Katsuro ....................... 361/721
2011/0292624 A1* 12/2011 Tanaka et al. ................ 361/752

FOREIGN PATENT DOCUMENTS

| JP | 11190468 A | 7/1999 |
| JP | 2003-258454 A | 9/2003 |
| JP | 3745670 B2 | 2/2006 |

* cited by examiner

ELECTRONIC CONTROLLER

BACKGROUND OF THE INVENTION

1. Field of the Invention

The present invention relates to an electronic controller including an electronic circuit board, which is provided with a connector at its end, and is housed in a case.

2. Description of the Related Art

An electronic controller used for controlling a vehicle or the like generally has the following structure. The electronic controller includes electronic components such as an input/output circuit, a communication circuit, a microcomputer, and a power supply circuit. The electronic components are provided on a printed circuit board which is an electronic circuit board. At the same time, a connector for connection to an external device is provided to the printed circuit board. Then, the printed circuit board is housed in a case.

As the above-mentioned type of electronic controller, the following electronic controller is known. The electronic controller uses a base and a cover which are vertically separated from each other. A printed circuit board, onto which connectors are mounted, is interposed between the base and the cover. Then, contact surfaces of the base, the cover, and the connectors are bonded with a water-proof sealing material (for example, see Japanese Patent Application Laid-open No. 2003-258454).

In the electronic controller having the configuration described above, however, the connectors are brought into contact with the base and the cover. Therefore, the connectors are required to be formed into a shape, for example, which can be brought into contact with the base and the cover. Therefore, there is a problem in that a general-purpose connector cannot be used as the connector for the electronic controller described above.

The shapes of the base and the cover may be changed according to the shape of the connector to cope with the above-mentioned problem. In this case, however, there is another problem in that the base and the cover are required to be set for each connector.

SUMMARY OF THE INVENTION

The present invention has been made to solve the problems described above, and has an object to provide an electronic controller which allows the use of a general-purpose connector and does not require the setting of a case for housing an electronic circuit board therein for respective connectors each having a different shape so as to enable a reduction in cost.

An electronic controller according to the present invention includes: an electronic circuit board onto which an electronic component is mounted; a connector provided at an end of the electronic circuit board; a case housing the electronic circuit board therein and including an opening portion on a side of the connector; and a connector retaining member provided between the connector and an inner wall surface of the opening portion so as to be held in close contact with the inner wall surface and to surround the connector.

The electronic controller according to the present invention includes the connector retaining member provided between the connector and the inner wall surface of the opening portion of the case so as to be held in close contact with the inner wall surface and to surround the connector. By changing the connector retaining member according to the shape of the connector, the case having the same shape can be generally used regardless of the shape of the connector. Thus, the cost of the case can be reduced by production volume effects.

Further, the outer shape of the connector itself is not required to be designed according to the shape of the case, and therefore an inexpensive general-purpose connector can be used. As a result, the cost can be further reduced.

BRIEF DESCRIPTION OF THE DRAWINGS

In the accompanying drawings:

FIG. 3A is a view illustrating the relation between a connector and a connector retaining member in FIG. 1, FIG. 3B and FIG. 3C are respectively other example views illustrating the relation between a connector and a connector retaining member;

DETAILED DESCRIPTION OF THE PREFERRED EMBODIMENTS

Hereinafter, an electronic controller according to each of embodiments of the present invention is described based on the accompanying drawings. In each of the drawings, the same or equivalent members and components are denoted by the same reference numerals for description.

Embodiment 1

Figure 1:
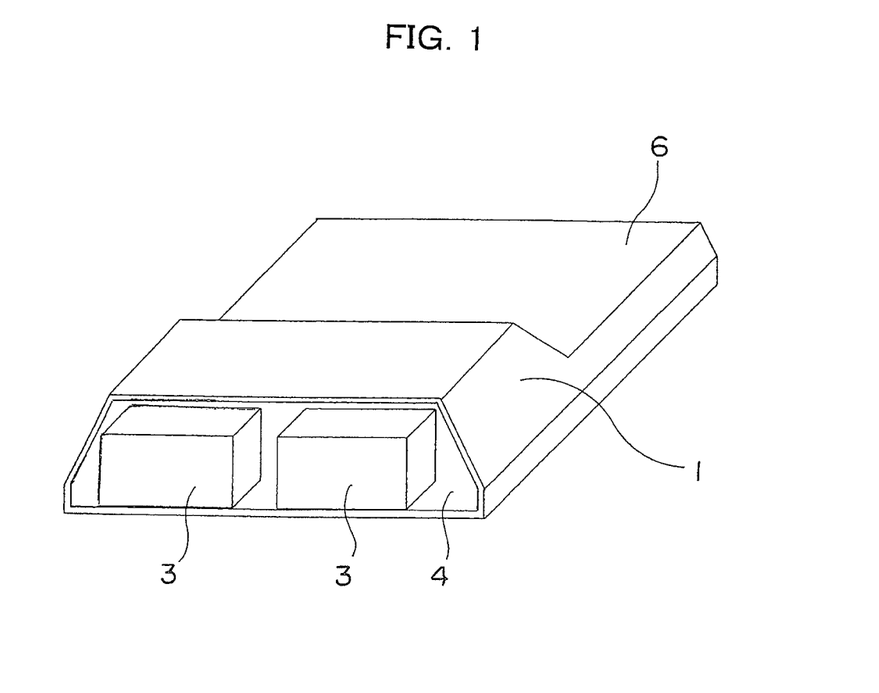
FIG. 1 is a perspective view illustrating an electronic controller according to Embodiment 1 of the present invention.
Figure 2:
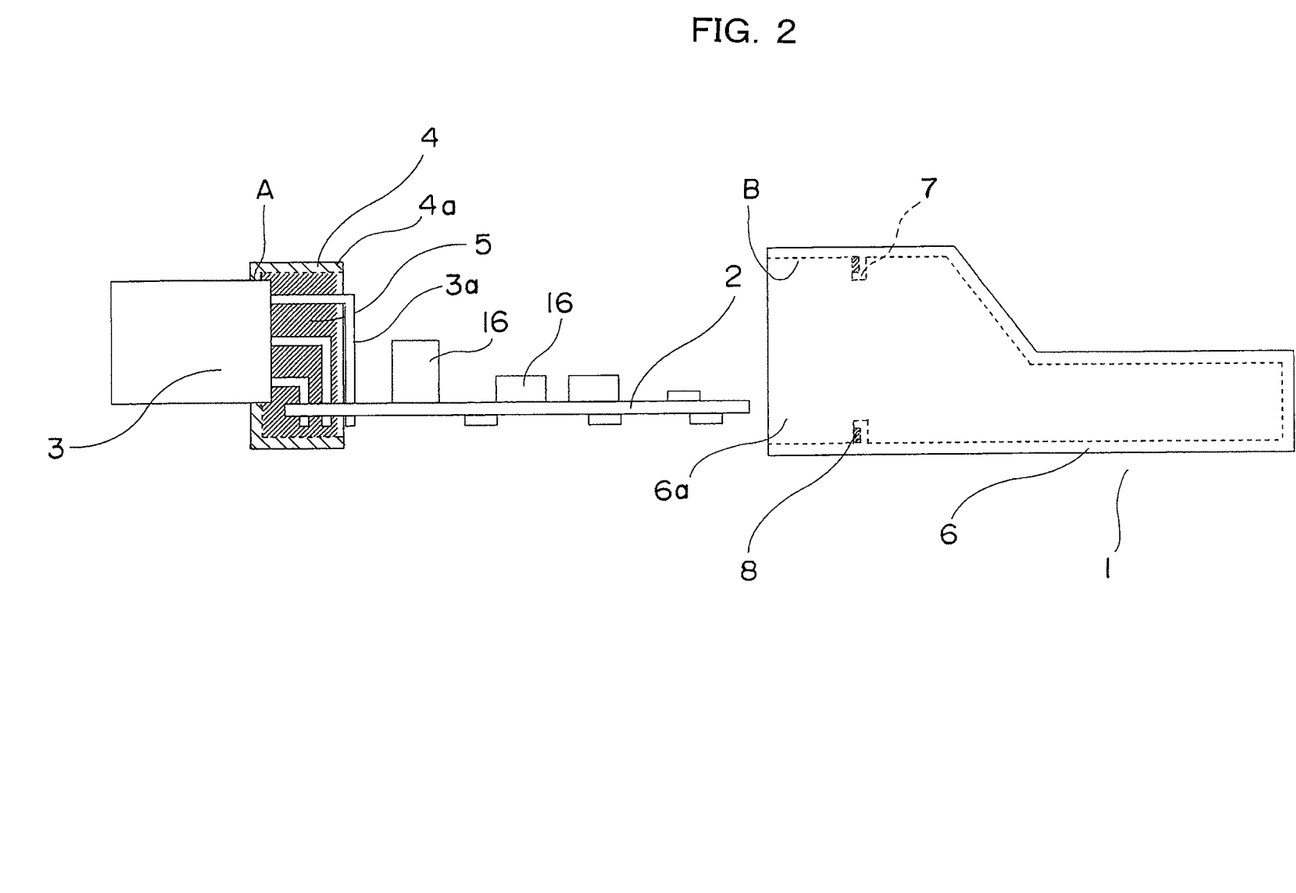
FIG. 2 is an exploded partial sectional view of the electronic controller illustrated in FIG. 1.

FIG. 1 is a perspective view illustrating an electronic controller 1 according to Embodiment 1 of the present invention, and FIG. 2 is an exploded partial sectional view of the electronic controller 1 illustrated in FIG. 1.

The electronic controller 1 mounted in an engine provided in an engine room includes an electronic circuit board 2 housed in a case 6. Electronic components 16 are mounted onto the electronic circuit board 2. The electronic circuit board 2 is electrically connected to terminals 3a of connectors 3 at an end. The connectors 3 are electrically connected to another input/output device (not shown).

The connectors 3 are mounted to an opening portion 6a of the case 6 through an intermediation of a connector retaining member 4. In an inner wall surface of the case 6, a groove portion 7 which is open toward the opening portion 6a is formed over the entire circumference.

The shape of the connector retaining member 4 corresponds to that of the opening portion 6a. A sealing material 8 is applied to the groove portion 7. A distal end portion 4a of the connector retaining member 4 is inserted into the groove portion 7 to be fitted into the opening portion 6a of the case 6. The interior of the connector retaining member 4 is filled with a filling material 5 made of, for example, a polyurethane resin. The filling material 5 prevents water from entering through interfaces A between the connectors 3 and the connector retaining member 4.

Figures 3A, 3B:
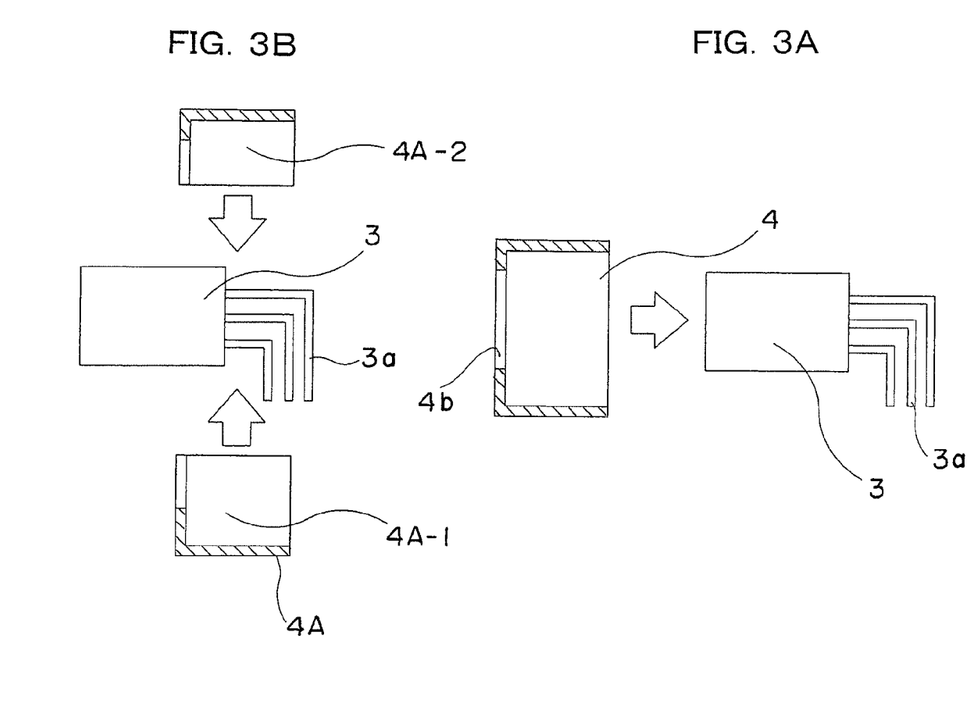

As illustrated in FIG. 3A, the connector retaining member 4 has holes 4b formed through a bottom surface. The connectors 3 are inserted into the holes 4b to integrate the connector retaining member 4 with the connectors 3.

Alternatively, as illustrated in FIG. 3B, a connector retaining member 4A may be formed of two vertically separate members, that is, a first connector retaining member 4A-1 and a second connector retaining member 4A-2. In this manner, the connector retaining members 4A-1 and 4A-2 are fitted into each other to vertically interpose the connectors 3 therebetween so as to be integrated with the connectors 3.

Figure 3C:
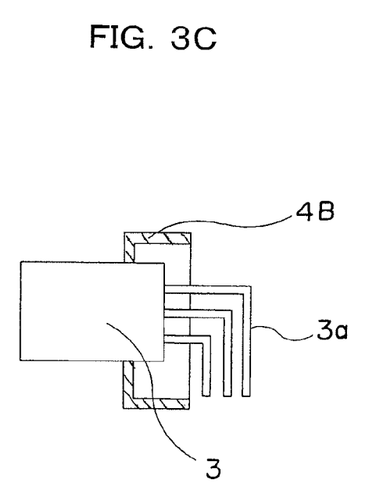

Further alternatively, as illustrated in FIG. 3C, a connector retaining member 4B may be formed by multiple-molding around the connectors 3 to be integrated with the connectors 3.

Next, an assembly procedure of the electronic controller 1 having the configuration described above is described.

First, the connectors 3 are inserted into the holes 4b of the connector retaining member 4 to integrate the connector retaining member 4 with the connectors 3.

Next, the terminals 3a of the connectors 3 and the electronic circuit board 2 are connected to each other.

Thereafter, the interior of the connector retaining member 4 is filled with the filling material 5 so as to leave the distal end portion 4a uncovered. Then, the filling material 5 is cured.

Subsequently, the electronic circuit board 2, to which the connectors 3 are mounted through the connector retaining member 4, is inserted through the opening portion 6a of the case 6 including the groove portion 7, to which the sealing material 8 is previously applied.

As a result, the connector retaining member 4 is fitted to the opening portion 6a, and the distal end portion 4a is fitted into the groove portion 7. Consequently, the connectors 3 are integrated with the case 6 through an intermediation of the connector retaining member 4 to fabricate the electronic controller 1.

In the case where the filling material 5 filling the interior of the connector retaining member 4 has a small height which does not cover the terminals 3a of the connectors 3, each of the connector terminals 3a, which is supported in a cantilever fashion without being covered with the filling material 5, may be electrically connected to the electronic circuit board 2 after the interior of the connector retaining member 4 is filled with the filling material 5 and the filling material 5 is cured.

The electronic controller 1 according to this embodiment includes the connector retaining member 4 which is provided between the connectors 3 and the inner wall surface of the opening portion 6a and is held in close contact with the inner wall surface so as to close the opening portion 6a in cooperation with the connectors 3. Therefore, by changing the connector retaining member 4 according to the shapes of the connectors 3, the case 6 having the same shape can be generally used regardless of the shapes of the connectors 3. Thus, the cost of the case can be reduced by production volume effects.

Moreover, the outer shapes of the connectors 3 themselves are not required to be designed according to the shape of the case 6. Therefore, an inexpensive general-purpose connector can be used as each of the connectors 3. Accordingly, the cost can be further reduced.

Further, although the filling material 5 fills the interior of the connector retaining member 4 so as to seal the interfaces A between the connectors 3 and the connector retaining member 4, the filling material 5 does not fill the entire interior of the case 6.

Therefore, a filling amount of the filling material 5 can be reduced to reduce a weight of the electronic controller 1. In addition, when the electronic controller 1 is to be discarded, the electronic controller 1 can be easily disassembled, which can reduce an environmental load.

Moreover, the connector retaining member 4 has a bottomed cylindrical shape, which has the holes 4b formed through the bottom surface. By inserting the connectors 3 into the holes 4b, the connector retaining member 4 and the connectors 3 can be easily integrated with each other.

Further, the interfaces A between end surfaces of the holes 4b of the connector retaining member 4 and the circumferential surfaces of the connectors 3 are sealed with the filling material 5. Therefore, water can be prevented from entering the interior of the case 6 through the interfaces A.

The interfaces A between the connectors 3 and the connector retaining member 4B, which are connected to each other by multiple-molding, are also sealed with the filling material 5. Therefore, even in this case, water can be prevented from entering the interior of the case 6 through the interfaces A.

Moreover, an interface B between an outer circumferential surface of the connector retaining member 4 and the inner wall surface of the case 6 is sealed by the groove portion 7, the sealing material 8, and the distal end portion 4a, which constitute sealing means. Therefore, water can be prevented from entering the interior of the case 6 through the interface B.

As described above, in the electronic controller 1 which is mounted to the engine and exposed to water, water can be more reliably prevented from entering the interior of the case 6 by sealing the interfaces A of the connector retaining member 4 with the filling material 5 and sealing the interface B of the connector retaining member 4 with the sealing means.

The groove portion 7 not only corresponds to one of the constituent elements of the sealing means but also serves as a positioning member for the connector retaining member 4 with respect to the case 6.

Figure 4A:
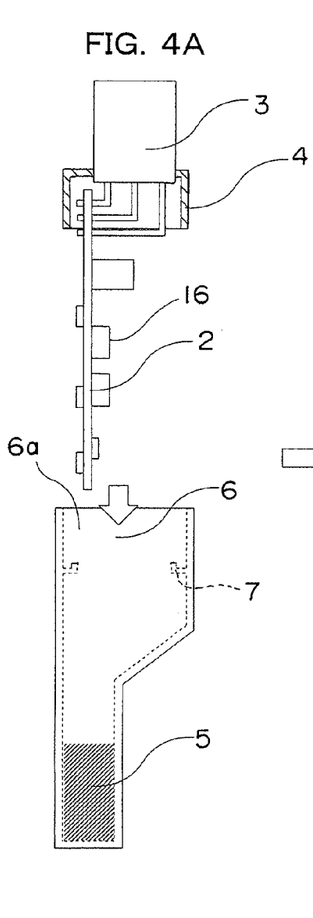
FIGS. 4A to 4C are views illustrating an assembly procedure simultaneously sealing with a filling material a interfaces between the connector and the connector retaining member and a interface between the connector retaining member and a case in the electronic controller of FIG. 1.
Figure 4B:
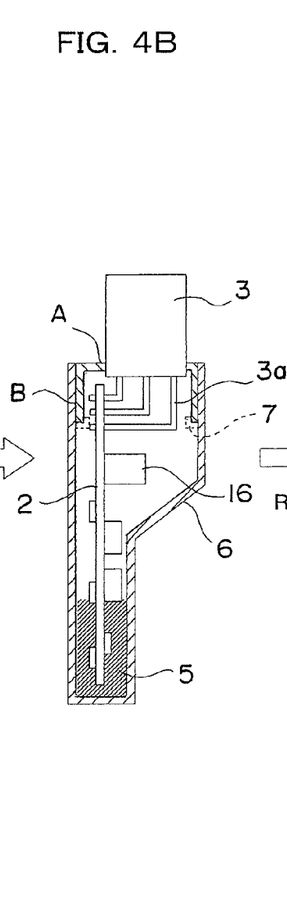
Figure 4C:
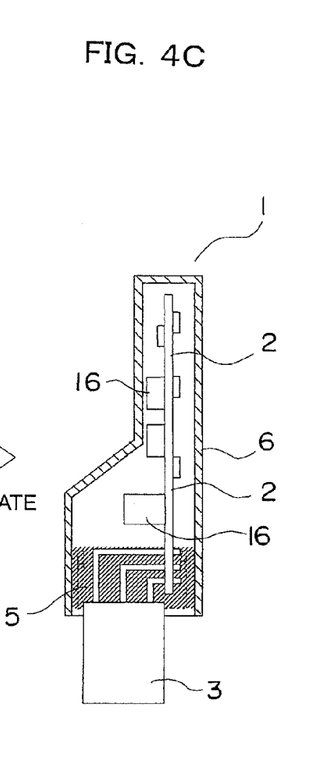

The above-mentioned electronic controller 1 can also be fabricated by a procedure illustrated in FIGS. 4A to 4C.

First, the filling material 5 is injected into the case 6 with the opening portion 6a being oriented upward (FIG. 4A).

Next, the electronic circuit board 2, to which the connectors 3 and the connector retaining member 4 are mounted, is inserted into the case 6 (FIG. 4B). Thereafter, the electronic controller 1 is rotated at 180 degrees (FIG. 4C). Then, the filling material 5 is cured. As a result, the electronic controller 1, in which the connectors 3 are integrated with the case 6 through an intermediation of the connector retaining member 4, is fabricated.

In the case where the fabrication method is used, the sealing material 8 is not required to be previously applied to the groove portion 7. Therefore, an application step is not needed. In addition, the interfaces A between the connectors 3 and the connector retaining member 4 and the interface B between the connector retaining member 4 and the case 6 are simultaneously sealed with the filling material 5. Therefore, as compared to the electronic controller 1 illustrated in FIG. 2, a fabrication time is reduced.

Embodiment 2

Figure 5:
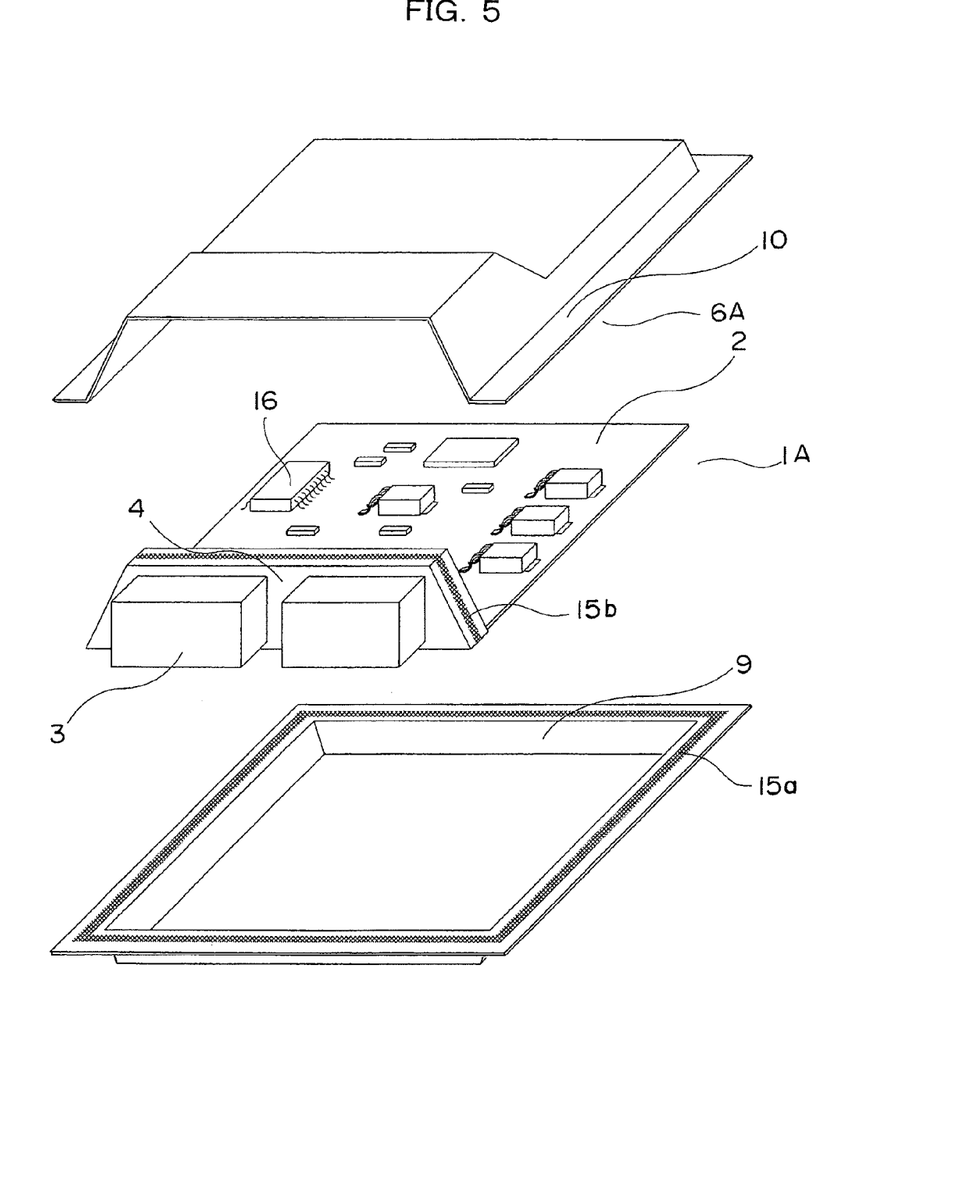
FIG. 5 is an exploded perspective view of an electronic controller according to Embodiment 2 of the present invention.

FIG. 5 is an exploded perspective view illustrating an electronic controller 1A according to Embodiment 2 of the present invention.

In the electronic controller 1A according to Embodiment 2, a case 6A includes a base 9 and a cover 10. The base 9 is made of a metal having high heat-radiating effects. The cover 10 houses the electronic circuit board 2 in cooperation with the base 9. The base 9, the connector retaining member 4, and the cover 10 are bonded to each other by an adhesive 15a. The cover 10 and the connector retaining member 4 are bonded to each other by an adhesive 15b.

In this embodiment, the adhesive 15b corresponds to the sealing means of Embodiment 1.

The adhesive 15b, which is present between the cover 10 and the connector retaining member 4, is applied to a surface of the connector retaining member 4. In this case, when the adhesive is to be applied by using an adhesive application machine including a nozzle which is movable only horizontally, the adhesive is not applied to vertical surfaces.

However, the connector retaining member 4 according to this embodiment has a trapezoidal shape having inclined surfaces. Therefore, even when the adhesive application machine is used, the adhesive is applied to the inclined surfaces.

It is apparent that the connector retaining member is required to have the same shape as that of the opening portion 6a of the case 6A. However, the shape of the connector retaining member is not limited to the trapezoidal shape. The connector retaining member may have a rectangular shape although the adhesive cannot be applied by using the adhesive application machine.

The remaining configuration is the same as that of the electronic controller 1 according to Embodiment 1.

An adhesive (not shown) is present between the connector retaining member 4 and the opening portion 6a of the case 6A. The adhesive is applied to the surface of the connector retaining member 4. In this case, when the adhesive is applied by using the adhesive application machine including a nozzle which is movable only horizontally, the adhesive is not applied to vertical surfaces.

However, the connector retaining member 4 according to this embodiment has the trapezoidal shape having the inclined surfaces. Therefore, even when the adhesive application machine is used, the adhesive is applied to the inclined surfaces.

It is apparent that the connector retaining member is required to have the same shape as that of the opening portion 6a of the case 6A. However, the shape of the connector retaining member is not limited to the trapezoidal shape. The connector retaining member may have a rectangular shape although the adhesive cannot be applied by using the adhesive application machine.

The electronic controller 1A according to this embodiment is assembled by vertically interposing the electronic circuit board 2, onto which the connectors 3 are mounted, between the cover 10 and the base 9, instead of inserting the electronic circuit board 2, onto which the connectors 3 are mounted, through the opening portion 6a of the case 6.

Therefore, even when the case 6A has such a shape that makes the insertion of the electronic circuit board 2 through the opening portion 6a of the case 6A difficult, the electronic controller 1A can be easily assembled.

Moreover, the base 9 is made of the metal having high heat-radiating effects. Therefore, heat from the electronic components 16 is efficiently radiated to outside through the base 9.

The other functions and effects are the same as those of the electronic controller 1 according to Embodiment 1.

Embodiment 3

Figure 6:
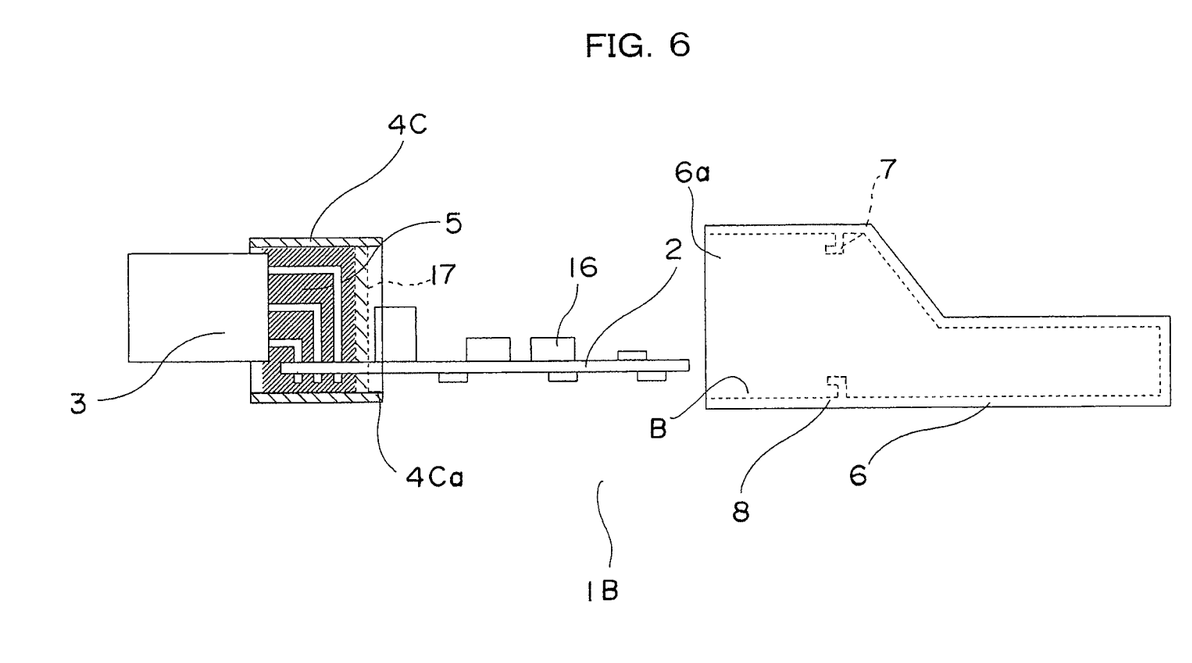
FIG. 6 is an exploded partial sectional view of an electronic controller according to Embodiment 3 of the present invention.

FIG. 6 is an exploded partial sectional view illustrating an electronic controller 1B according to Embodiment 3 of the present invention.

The electronic controller 1B according to Embodiment 3 includes a wall portion 17 on one of openings (on the right side of FIG. 6) of a connector retaining member 4C having a cylindrical shape. The filling material 5 to fill the interior of the connector retaining member 4C is injected from the side of the connectors 3.

A gap is present between the connectors 3 and the connector retaining member 4C. The filling material 5 is provided in the gap.

The remaining configuration is the same as that of the electronic controller 1 according to Embodiment 1.

The electronic controller 1B according to Embodiment 3 can provide the same effects as those of the electronic controller 1 according to Embodiment 1. In addition, the filling material 5 is injected from the side of the connectors 3 and is stopped by the wall portion 17. Therefore, a distal end portion 4Ca of the connector retaining member 4C is ensured to have a predetermined dimension without being affected by the filling material 5. As a result, the distal end portion 4Ca can be reliably fitted into the groove portion 7 of the case 6.

Embodiment 4

Figure 7A:
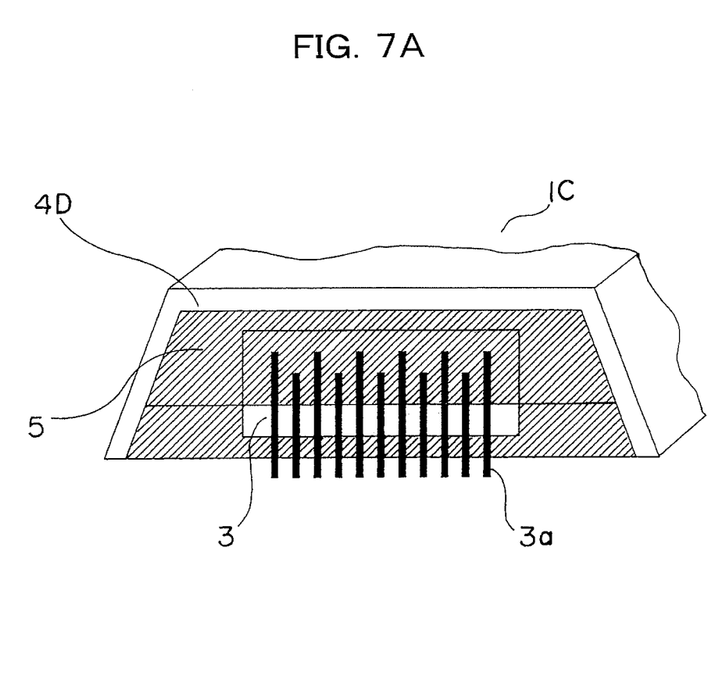
FIG. 7A is a front view illustrating a principal part of an electronic controller according to Embodiment 4 of the present invention.
Figure 7B:
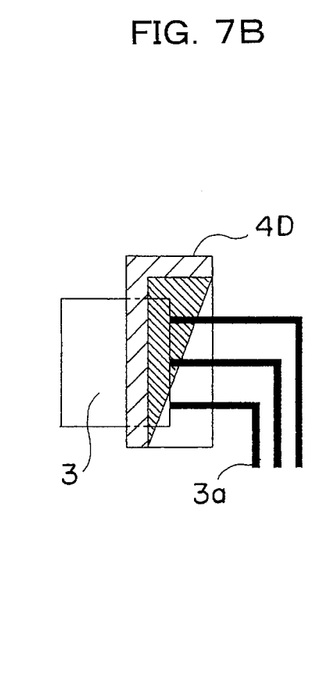
FIG. 7B is a partial side sectional view of FIG. 7A.

FIG. 7A is a front view illustrating a principal part of an electronic controller 1C according to Embodiment 4 of the present invention, and FIG. 7B is a partial side sectional view of FIG. 7A.

The electronic controller 1C includes a connector retaining member 4D having a U-shaped cross section with opposed sides being separated from each other downwardly.

In the case where the connector retaining member 4 having a four-sided frame is to be connected to the connectors 3 by multiple-molding, if distal end potions of the terminals 3a, which are bent at 90 degrees in the middle, project from the frame of the connector retaining member 4, the multiple-molding cannot be performed in view of a structure of a molding die.

However, the connector retaining member 4D does not have a frame portion on the side from which the terminals 3a project. Therefore, the multiple-molding can be performed.

Figure 8:
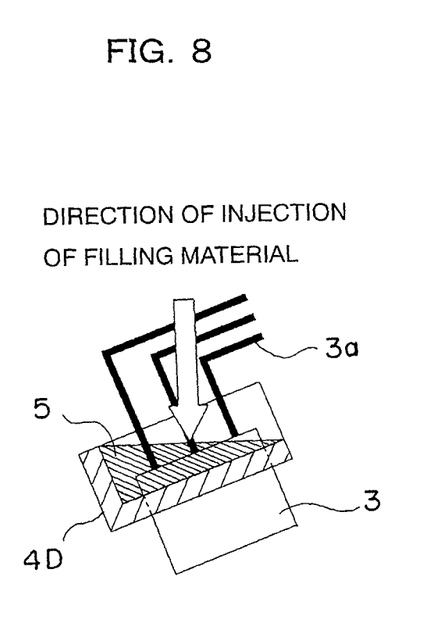
FIG. 8 is a view illustrating a mode simultaneously sealing with a filling material a interfaces between the connector and the connector retaining member in FIG. 7.

In the electronic controller 1C, the connectors 3 are surrounded by the connector retaining member 4D having a three-sided frame. As illustrated in FIG. 8, the interfaces A on the three sides between the connectors 3 and the connector retaining member 4D are sealed by injecting the filling material 5 into the interior of the connector retaining member 4D under a state in which the connector retaining member 4D is inclined.

The remaining configuration is the same as that of the electronic controller 1 according to Embodiment 1.

The electronic controller 1C according to Embodiment 4 can provide the same effects as those of the electronic controller 1 according to Embodiment 1. In addition, even when the distal end portions of the terminals 3a which are bent at 90 degrees in the middle project from the frame of the connector retaining member 4D, the multiple-molding can be performed.

Each of the electronic controllers 1 to 1C according to Embodiments 1 to 4 is mounted to the engine provided in the engine room and is therefore under an environment which is subjected to a sudden change in temperature.

Therefore, if dew condensation or the like occurs inside the case 6 or 6A, there is a fear in that an electronic circuit of the electronic circuit board 2 is short-circuited by water drops generated by the dew condensation to result in a failure.

In order to cope with the above-mentioned problem, for example, the electronic circuit board 2 may be coated with a coating material such as a silicon resin to provide moisture-proof coating.

The engine provided in the engine room is an example of the location at which each of the electronic controllers 1 to 1C according to the present invention is mounted. It is apparent that each of the electronic controllers of the present invention can be provided at the location other than in the engine room.

Although the sealing means formed of the groove portion 7, the sealing material 8, and the distal end portion 4a or 4Ca is described as the sealing means for sealing the interface B between the case 6 and the connector retaining member 4, 4C, or 4D in each of the embodiments described above, it is apparent that the sealing means is not limited thereto. For example, a groove portion may be provided in the case 6 or the connector retaining member 4, 4C, or 4D so that an O-ring is fitted into the groove portion.

Further, although the filling material 5 is used as means for sealing the interfaces A between the connectors 3 and the connector retaining member 4, 4C, or 4D, it is apparent that the means for sealing the interfaces A is not limited thereto. For example, the interfaces A may be sealed by using an adhesive in addition to the use of the filling material.

Further, each of the cases 6 and 6A of the electronic controllers 1 to 1C according to Embodiments 1 to 4 described above has a shape which is enlarged on the side of the connectors 3. However, it is apparent that the present invention is applicable to a case having a uniform height over the entire case.

Further, the shape of each of the connector retaining members 4, 4C, and 4D is not limited to that surrounds the connectors 3 with the four-sided or three-sided frame. The connector retaining member may have a frame with five or more sides to surround the connectors 3.

What is claimed is:

1. An electronic controller, comprising:
   an electronic circuit board onto which an electronic component is mounted;
   a connector provided at an end of the electronic circuit board;
   a case housing the electronic circuit board therein and including an opening portion on a side of the connector; and
   a connector retaining member provided between the connector and an inner wall surface of an edge portion of the opening portion and held in close contact with the inner wall surface so as to close the opening portion in cooperation with the connector,
   wherein an outer wall surface of the connector retaining member contacts with the inner wall surface of the edge portion of the opening portion.

2. An electronic controller according to claim 1, wherein the connector retaining member has a bottomed cylindrical shape having a hole formed through a bottom surface thereof, and the connector is inserted into the hole.

3. An electronic controller according to claim 1, wherein the connector retaining member comprises more than one retention member piece obtained by dividing the connector retaining member, the more than one retention member piece being fitted over a circumferential surface of the connector.

4. An electronic controller according to claim 1, wherein the connector retaining member is provided to the connector by multiple-molding.

5. An electronic controller according to claim 1, wherein an interior of the connector retaining member is filled with a filling material, and an interface between the connector and the connector retaining member is sealed with the filling material.

6. An electronic controller according to claim 5, wherein the connector retaining member surrounds the connector with a frame having at least three sides.

7. An electronic controller according to claim 1, wherein an interface between an outer circumferential surface of the connector retaining member and an inner wall surface of the case is sealed by sealing means.

8. An electronic controller according to claim 7, wherein the sealing means comprises a groove portion formed in the inner wall surface of the case so as to be open toward the opening portion, and a distal end portion of the connector retaining member inserted through the opening portion to be fitted into the groove portion through an intermediation of a sealing material.

9. An electronic controller according to claim 1, wherein the case comprises a base on which the electronic circuit board is placed, and a cover housing the electronic circuit board therein in cooperation with the base.

10. An electronic controller according to claim 1, wherein the electronic circuit board has a surface being subjected to moisture-proof coating.

11. An electronic controller according to claim 1, wherein the electronic controller is provided in an engine room.

12. An electronic controller according to claim 1, wherein the connectors are mounted to the electronic circuit board through the connector retaining member.

13. An electronic controller according to claim 1, wherein the shape of the connector retaining member corresponds to a shape of the opening portion and a size of the opening portion.

14. An electronic controller according to claim 1, wherein the connector retaining member is located inside the case housing.

15. An electronic controller according to claim 1, wherein the inner wall surface of the edge portion faces the connector.

16. An electronic controller according to claim 1, wherein the inner wall surface of the edge portion forms an inner circumference outlining the opening in the case housing.

* * * * *